US008189414B2

United States Patent
Lovett

(10) Patent No.: US 8,189,414 B2
(45) Date of Patent: *May 29, 2012

(54) MAINTENANCE OF AMPLIFIED SIGNALS USING HIGH-VOLTAGE-THRESHOLD TRANSISTORS

(75) Inventor: Simon J. Lovett, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 57 days.

This patent is subject to a terminal disclaimer.

(21) Appl. No.: 12/772,681

(22) Filed: May 3, 2010

(65) Prior Publication Data

US 2010/0277998 A1  Nov. 4, 2010

Related U.S. Application Data

(63) Continuation of application No. 12/027,824, filed on Feb. 7, 2008, now Pat. No. 7,710,805.

(51) Int. Cl.
*G11C 7/00* (2006.01)

(52) U.S. Cl. ............ 365/205; 365/149; 365/226
(58) Field of Classification Search ............ 365/149, 365/205, 226
See application file for complete search history.

(56) References Cited

U.S. PATENT DOCUMENTS

| 6,028,453 | A | * | 2/2000 | Kong | 326/113 |
| 6,088,275 | A | | 7/2000 | Tanaka | |
| 2007/0097765 | A1 | | 5/2007 | Huang et al. | |

* cited by examiner

*Primary Examiner* — Hoai V Ho
(74) *Attorney, Agent, or Firm* — Leffert Jay & Polglaze, P.A.

(57) ABSTRACT

Systems, apparatus, memory devices, sense amplifiers and methods are provided, such as a system that includes an input node, a first transistor having a gate that couples to the input node, and a second transistor having another gate that couples to the input node. In one or more embodiments, the second transistor has a greater activation voltage threshold than does the first transistor and the first transistor amplifies a signal that is present on the input node. In one such embodiment, after the first transistor amplifies the signal, the second transistor maintains the amplified signal on the input node while the first transistor is deactivated.

17 Claims, 2 Drawing Sheets

MAINTENANCE OF AMPLIFIED SIGNALS USING HIGH-VOLTAGE-THRESHOLD TRANSISTORS

RELATED APPLICATIONS

This Patent application is a continuation of U.S. patent application Ser. No. 12/027,824, filed Feb. 7, 2008, entitled "MAINTENANCE OF AMPLIFIED SIGNALS USING HIGH-VOLTAGE-THRESHOLD TRANSISTORS," (now U.S. Pat. No. 7,710,805), which is incorporated by reference herein in its entirety.

BACKGROUND

Sense amplifiers are often used in memory devices, such as Dynamic Random Access Memory (DRAM) devices, to amplify low-voltage signals read from memory cells. Sense amplifiers generally contain multiple transistors. Because the signals read from the memory cells are low-voltage signals, these transistors are often fabricated to be sensitive to small voltages. However, sensitive transistors often leak current, thereby wasting power.

BRIEF DESCRIPTION OF THE DRAWINGS

For a detailed description of illustrative embodiments of the invention, reference will now be made to the accompanying drawings in which.

NOTATION AND NOMENCLATURE

Figure 1:
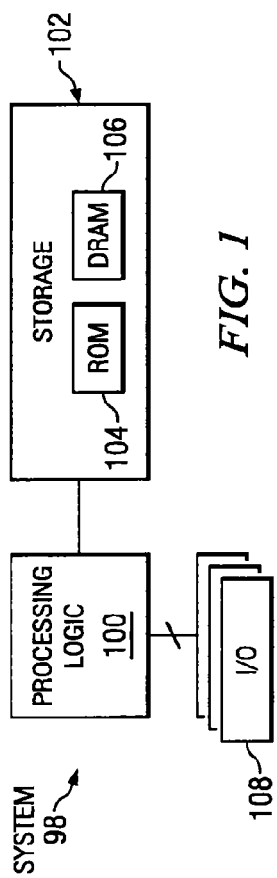
FIG. 1 shows an illustrative electronic system in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. The term "connection" refers to any path via which a signal may pass. For example, the term "connection" includes, without limitation, wires, traces and other types of electrical conductors, optical devices, etc. The term "system" may include a memory device or any suitable system that implements memory devices, such as a desktop computer, a laptop or notebook computer, a server, an electronic imaging device, an electronic video device, an electronic audio device, a printer, and other such electronic devices. The term "maintain" may be construed to denote the act of keeping something (e.g., voltage, current) steady, relatively steady, constant, relatively constant, or a similar meaning.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be illustrative of that embodiment, and not intended to intimate that the scope of the disclosure, including the claims, is limited to that embodiment.

Disclosed herein is, among other things, a sense amplifier that detects and amplifies low-voltage signals read from storage devices (e.g., Dynamic Random Memory Access (DRAM) devices) while conserving power. In at least some embodiments, the sense amplifier comprises two p-channel transistors and four n-channel transistors. Two of the n-channel transistors have low threshold voltage levels, while the remaining two n-channel transistors have relatively higher threshold voltage levels. One of the two low-threshold-voltage n-channel transistors is used to sense and amplify a low-voltage signal read from memory. The low-threshold-voltage transistor is then shut off and one of the high-threshold-voltage n-channel transistors is used to maintain the amplified voltage. Because the high-threshold-voltage transistor leaks less current than does the low-threshold-voltage transistor, power is conserved.

FIG. 1 shows an illustrative electronic system 98. The electronic system 98 comprises any suitable system that implements memory devices, such as a desktop computer, a laptop or notebook computer, a server, an electronic imaging device, an electronic video device, an electronic audio device, a printer, etc. The electronic system 98 comprises processing logic 100 (e.g., a processor), storage 102 and a plurality of input/output (I/O) devices 108 (e.g., keys, displays). The storage 102 comprises various types of memory devices, such as read-only memory (ROM) 104, DRAM 106, etc. When executing software or performing some other task, the processing logic 100 may access data stored in the storage 102. For example, the processing logic 100 may read data stored in the DRAM 106.

Figure 2:
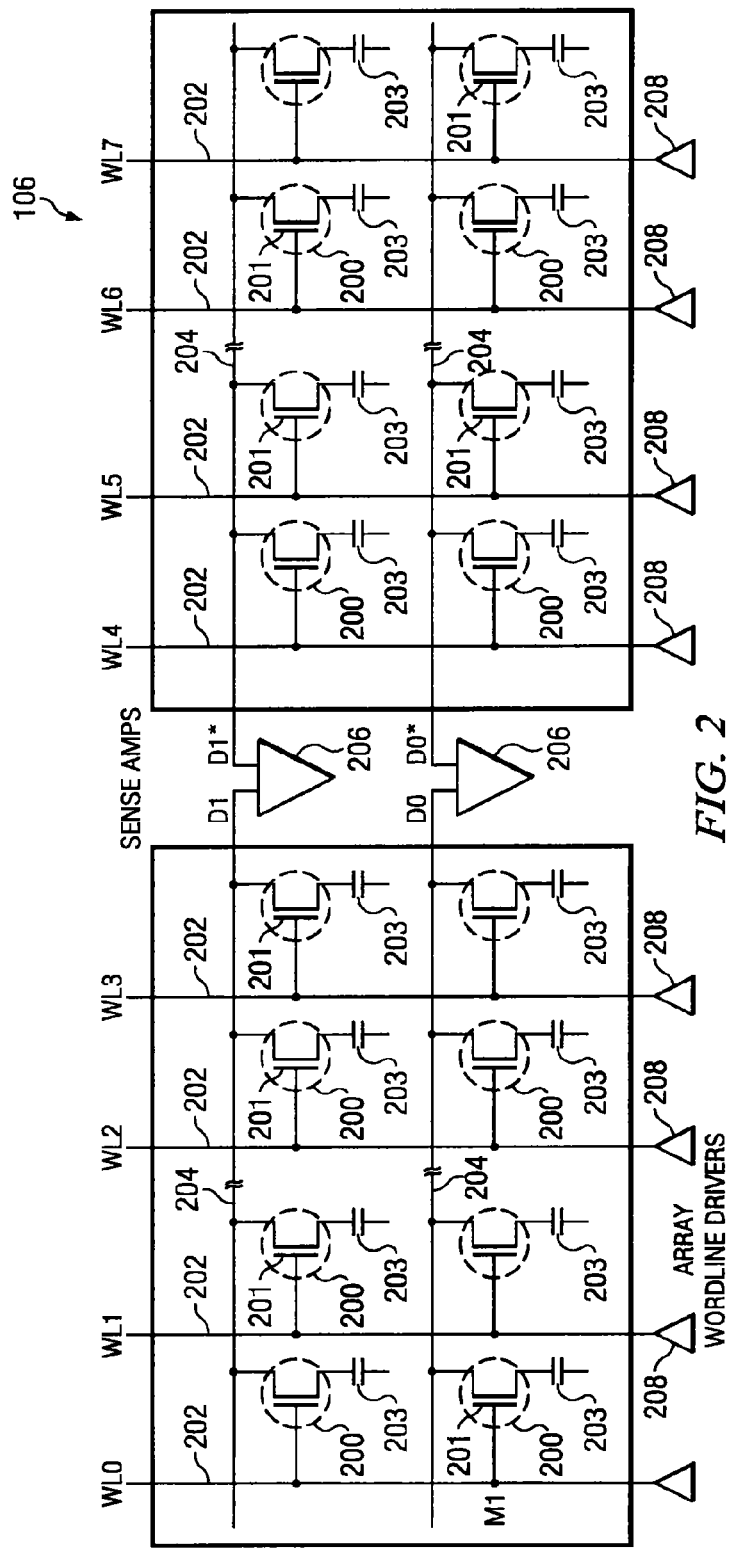
FIG. 2 shows an illustrative storage device, in accordance with various embodiments.

FIG. 2 shows a detailed view of an illustrative DRAM 106. The DRAM 106 shown in FIG. 2 is an open DRAM array, although, as described below, other types of DRAM arrays (e.g., folded DRAM arrays) and other types of memory in general (e.g., Synchronous DRAM (SDRAM), RAM) may be used. The DRAM 106 comprises a plurality of memory cells 200, access lines (such as word lines 202), data lines (such as digit lines 204), sense amplifiers 206 and word line drivers 208 used to drive the word lines 202. The memory cells 200 are arranged in an array, e.g., grid, format. Each memory cell 200 comprises an access device, such as transistor 201, and a capacitor 203. Charge stored by the capacitor 203, which may represent a digit (e.g., bit) of data, may be read by activating the transistor 201. The transistor 201 is activated using word lines 202 and digit lines 204. By activating and/or deactivating the word lines 202 and digit lines 204 such that a sufficient voltage is applied across the transistor 201, the transistor 201 is activated and permits the charge stored by the capacitor 203 to be read. Charge may be written to the capacitor 203 in a similar manner, such as to "store" a digit of data.

Data read from a capacitor 203 of a memory cell 200 is transferred along a digit line 204 to a sense amplifier 206. The sense amplifier receives the data in the form of a low-voltage signal, amplifies the signal and outputs the amplified signal back onto the digit line 204. In this way, the amplified signal not only is available for subsequent output, but also refreshes the memory cell 200 from which the original, low-voltage data signal was read.

Figure 3:
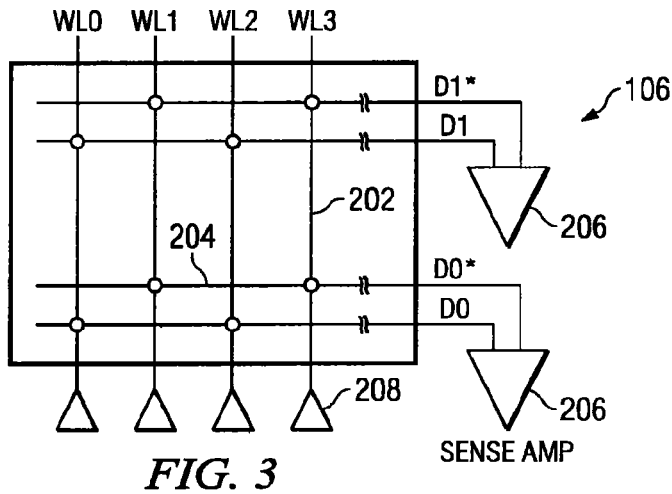
FIG. 3 shows another illustrative storage device, in accordance with various embodiments.

FIG. 3 shows another illustrative DRAM 106. The DRAM 106 shown in FIG. 3 comprises a folded-DRAM array. Like the DRAM 106 shown in FIG. 2, the DRAM 106 of FIG. 3 comprises word lines 202, digit lines 204, sense amplifiers 206 and word line drivers 208 (although present, the memory cells 200 are not shown in the figure for brevity). However, in the DRAM 106 of FIG. 3, the sense amplifiers 206 couple to the word lines 202 and digit lines 204 in an alternating fashion, as shown. Implementation of the sense amplifier disclosed herein in any and all such variations on DRAM, SDRAM, RAM, and other memory devices are encompassed within the scope of this disclosure.

Figure 4:
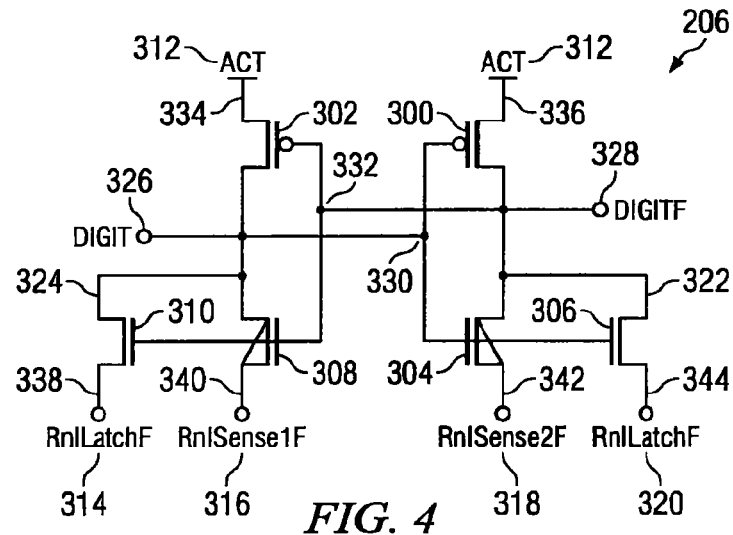
FIG. 4 shows an illustrative sense amplifier, in accordance with various embodiments.

FIG. 4 shows an illustrative sense amplifier 206. The sense amplifier 206 comprises p-channel transistors 300 and 302, n-channel transistors 304, 306, 308 and 310, an active pull-up power supply signal (hereinafter "ACT") 312, a Rn1LatchF signal 314, a Rn1SenseF signal 316, a Rn1Sense2F signal 318, and a Rn1LatchF signal 320. The sense amplifier 206 further comprises nodes 322, 324, 326, 328, 330, 332, 334, 336, 338, 340, 342 and 344. In at least some embodiments, the nodes 316 and 318 are kept separate (i.e., the nodes 316 and 318 are not coupled together and/or the nodes 316 and 318 are not connected together). Further, in at least some embodiments, the p-channel transistors could be replaced with n-channel transistors, and vice versa.

Figure 5:
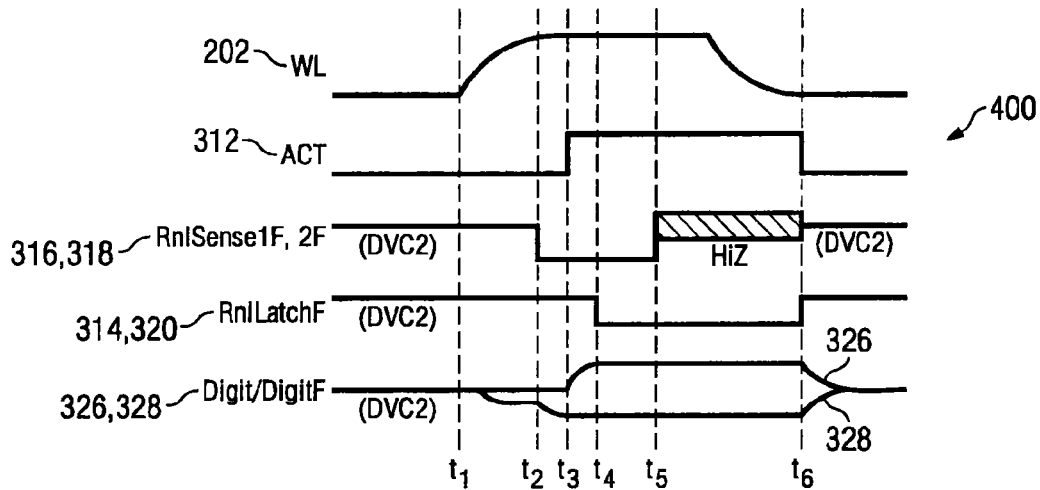
FIG. 5 shows a timing diagram associated with the devices of FIGS. 2 and 3 and the sense amplifier of FIG. 4, in accordance with various embodiments.

In at least some embodiments, the n-channel transistors 304 and 308 have low threshold voltages (e.g., 0.2 V to 0.3 V). These voltages may be identical or similar and referred to as $V_{t1}$. In some such embodiments, the n-channel transistors 306 and 310 have relatively higher threshold voltages (e.g., 0.4 V to 0.5 V) when compared to the threshold voltages of the transistors 304 and 308. In some embodiments, the difference between threshold voltages for the transistors 304, 308 and the transistors 306, 310 may be 0.1 V to 0.3 V. These voltages may be identical or similar and referred to as $V_{t2}$. As described in detail below, the low-threshold-voltage transistors 304 and 308 are used at least in part because they are sensitive to the low-voltage signals read from memory cells 200 in DRAM 106. However, because these transistors 304 and 308 leak current when DRAM page(s) corresponding to the transistors 304 and/or 308 are activated, in one or more embodiments, the transistors 304 and 308 are used only to sense and amplify the low-voltage signals. In one or more embodiments, neither of the transistors 304 and 308 is used to maintain an amplified signal on the digit line 204. Instead, after one of the low-threshold-voltage transistors 304 or 308 has sensed the low-voltage signal and amplified the low-voltage signal (as described below), that transistor 304 or 308 is shut down once a corresponding one of the high-threshold-voltage transistors 306 and 310 is activated. Once activated, that high-threshold-voltage transistor 306 or 310 maintains the amplified signal on the node 322 or 324. FIG. 5 is now briefly described, followed by an illustrative description of the operation of the sense amplifier 206 with reference to both FIGS. 4 and 5.

FIG. 5 shows an illustrative timing diagram 400 of the word line (WL) 202, ACT 312, Rn1Sense1F 316, Rn1Sense2F 318, Rn1LatchF 314, 320, Digit 326 and DigitF 328 signals. Specific instants of time that are described below include $t_1$-$t_6$. Referring now to FIGS. 4 and 5, the sense amplifier 206 receives low-voltage signals on nodes 324 and 322 from digit lines 204 (shown in FIGS. 2-3). The low-voltage signals received on nodes 324 and 322 generally are slightly different from each other, so that a voltage potential is generated between the nodes 324 and 322. This voltage differential between nodes 324 and 322 is shown between $t_1$ and $t_2$ (refer to the Digit signal 326 and DigitF signal 328) when WL 202 is activated. At $t_2$, WL 202 reaches its maximum voltage level, meaning that the low-voltage signals Digit and DigitF on nodes 324 and 322 have stabilized and are ready to be amplified.

Accordingly, at time $t_2$, circuit logic (not shown) coupled to the signals 314, 316, 318 and 320 causes the Rn1Sense1F signal 316 and Rn1Sense2F signal 318 to be dropped from Vcc/2 to LOW (e.g., to a reference potential such as ground (GND)), as shown in FIG. 5. As the voltage difference between Rn1Sense1F signal 316 at node 340 and the Digit signal 326 at node 324 approaches $V_{t1}$, and as the voltage difference between Rn1Sense2F signal 318 at node 342 and the DigitF signal 328 at node 322 approaches $V_{t1}$, the n-channel transistor 304, 308 whose gate is coupled to the higher voltage line begins to conduct. Stated otherwise, because the voltages on nodes 340 and 342 are the same or substantially similar, the first transistor 304 or 308 to have an activation voltage develop across it that surpasses $V_{t1}$ will be activated before the other. In turn, the activated transistor 304 or 308 begins conducting current, thereby discharging the lower voltage line (i.e., either node 324 or 322). When the lower voltage line is discharged, it causes the p-channel transistor 300 or 302 to which it is coupled to be activated. The activated p-channel transistor conducts current between ACT 312 (e.g., a HIGH power supply signal) and the higher voltage line (i.e., either node 322 or 324). In this way, the higher voltage line is amplified from a weak HIGH signal to a strong HIGH signal.

For example, assume that a greater voltage signal is present at node 324 than at node 322. Accordingly, the n-channel transistor 304 will be activated before the n-channel transistor 308 is activated. When the n-channel transistor 304 is activated, current may flow between nodes 342 and 328. Because node 342 is at GND, node 322 is pulled toward GND as well. The transition of node 322 toward GND is shown between $t_2$ and $t_3$ in FIG. 5 (DigitF signal 328). Once node 322 is at GND, it provides a strong, LOW signal (relative to the low-voltage signal previously read from a memory cell 200) that is provided to node 332. Because node 332 is LOW, n-channel transistor 308 remains inactivated, but p-channel transistor 302 is activated. At this point, the ACT signal 312 (previously inactivated to conserve power, for example) is activated, as shown at $t_3$ in FIG. 5. When p-channel transistor 302 is activated, the node 324 is pulled up high by ACT signal 312, as shown by Digit signal 326 between $t_3$ and $t_4$. In turn, this HIGH signal is provided to node 330, which reinforces the activation of the n-transistor 304.

At $t_4$, both Digit 326 and DigitF 328 have reached full rail and need no further amplification. Accordingly, to minimize leakage via the activated n-channel transistor 304 or 308, the Rn1LatchF signals 314 and 320 are asserted LOW so as to activate one of the high-voltage threshold n-channel transistors 306 or 310. Neither of these transistors 306 or 310 was previously activated because $V_{t2}$ had not been established across either one of these transistors. However, now that the signals on nodes 324 and 322 are amplified, and Rn1LatchF 314 and 320 are pulled to GND, $V_{t2}$ is established across one of the transistors 306 or 310 (i.e., the transistor 306 or 310 whose gate couples to ACT signal 312; in the present example, transistor 306 would be activated and transistor 310 would remain inactive). In this way, the "responsibility" for maintaining the amplified voltage signals is transferred from the activated n-channel transistor 304 or 308 to the activated n-channel transistor 306 or 310. This transfer may be observed in FIG. 5.

Specifically, at $t_5$, the Rn1Sense1F and 2F signals 316 and 318 are increased above GND so that the activation voltage $V_{t1}$ no longer exists across either of the n-channel transistors 304 or 308. Thus, at $t_5$, both of the n-channel transistors 304 and 308 are inactive. However, as shown, despite the transistors 304 and 308 being shutoff, the signals on nodes 324 and 322 maintain their amplified states, because these amplified signals are maintained by the active p-channel transistor 302 (i.e., for the HIGH signal on node 324) and the active n-channel transistor 306 (i.e., for the LOW signal on node 322). During the time interval between $t_5$ and $t_6$, the low-voltage-threshold transistors 304 and 308 are off, thereby preventing current leakage, while the high-voltage threshold transistor 306 is on, thereby maintaining the amplified signal on the nodes 322. However, at $t_6$, when the transistor 306 is shut off so that all n-channel transistors are inactive, the nodes 322 loses its amplified signal and returns to its original state, as observed by comparing the signal on node 322 prior to $t_1$ after $t_6$. Similarly, at $t_6$, when the ACT signal 312 is shut off, the node 324 loses its amplified signal and returns to its original state, as observed by comparing the signal on node 324 prior to $t_1$ and after $t_6$.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of operating a memory device, the method comprising:
    activating a first transistor of a pair of parallel coupled transistors in response to a potential of a first data line, wherein the first transistor of the pair of parallel coupled transistors has a gate coupled to the first data line, a first source/drain region coupled to a second data line, and a second source/drain region coupled to receive a first control signal;
    activating another transistor in response to activating the first transistor of the pair of parallel coupled transistors, wherein the another transistor has a gate coupled to the second data line, a first source/drain region coupled to the first data line, and a second source/drain region coupled to a voltage source;
    activating a second transistor of the pair of parallel coupled transistors after activating the another transistor and while maintaining activation of the first transistor of the pair of parallel coupled transistors, wherein the second transistor of the pair of parallel coupled transistors has a gate coupled to the first data line, a first source/drain region coupled to the second data line, and a second source/drain region coupled to receive a second control signal; and
    deactivating the first transistor of the pair of parallel coupled transistors while maintaining activation of the second transistor of the pair of parallel coupled transistors and maintaining activation of the another transistor.

2. The method of claim 1, wherein activating the second transistor further comprises reducing a potential level of the second control signal.

3. The method of claim 1, wherein deactivating the first transistor further comprises increasing a potential level of the first control signal.

4. The method of claim 1, further comprising biasing the first data line to a potential level of the voltage source and biasing the second data line to a potential level of the second control signal after activating the second transistor of the pair of parallel coupled transistors.

5. The method of claim 1, further comprising deactivating a first transistor of a second pair of parallel coupled transistors and a second transistor of the second pair of parallel coupled transistors during the activation of the first transistor of the pair of parallel coupled transistors, the second transistor of the pair of parallel coupled transistors and the another transistor, wherein the first transistor of the second pair of parallel coupled transistors has a gate coupled to the second data line, a first source/drain region coupled to the first data line, and a second source/drain region coupled to receive a third control signal, and wherein the second transistor of the second pair of parallel coupled transistors has a gate coupled to the second data line, a first source/drain region coupled to the first data line, and a second source/drain region coupled to receive a fourth control signal.

6. The method of claim 5, further comprising deactivating a further transistor while deactivating the first transistor of a second pair of parallel coupled transistors and the second transistor of the second pair of parallel coupled transistors, wherein the further transistor has a gate coupled to the first data line, a first source/drain region coupled to the second data line, and a second source/drain region coupled to the voltage source.

7. The method of claim 1, wherein activating the first transistor of the pair of parallel coupled transistors in response to the potential of the first data line comprises activating the first transistor of the pair of parallel coupled transistors in response to a potential of a data line of a DRAM memory device.

8. A method of amplifying a difference between two signals in a memory device, the method comprising:
    receiving a first signal at a first node and receiving a second signal at a second node where the first signal has a higher potential than the second signal;
    activating a first transistor of a pair of parallel coupled transistors in response to the first signal to couple the second node to a reference potential;
    activating another transistor in response to coupling the second node to the reference potential to couple the first node to a voltage source;
    while the first transistor is activated, activating a second transistor of the pair of parallel coupled transistors to maintain the reference potential on the second node; and
    deactivating the first transistor while the second transistor of the pair of parallel coupled transistors maintains the reference potential on the second node.

9. The method of claim 8, wherein activating the another transistor further comprises activating the another transistor where the the another transistor comprises a transistor having a different channel type than each transistor of the pair of parallel coupled transistors.

10. The method of claim 8, wherein coupling the second node to a reference potential further comprises coupling the second node to a ground potential.

11. The method of claim 8, wherein activating the second transistor of the pair of parallel coupled transistors further comprises activating the second transistor of the pair of parallel coupled transistors where the second transistor of the pair of parallel coupled transistors has a higher activation voltage threshold than the first transistor of the pair of parallel coupled transistors.

12. The method of claim 8, wherein deactivating the first transistor of the pair of parallel coupled transistors further comprises deactivating the first transistor of the pair of parallel coupled transistors in response to increasing a potential level of a source/drain region of the first transistor of the pair of parallel coupled transistors.

13. A memory device, comprising:
an array of memory cells; and
a sense amplifier coupled to the array of memory cells, the sense amplifier comprising:
a first input coupled to receive a first signal;
a second input coupled to receive a second signal;
a first pair of parallel coupled transistors having commonly coupled control gates coupled to the first input, wherein the first pair of parallel coupled transistors is coupled to the second input and is configured to bias the second input to a reference potential when the first received signal is greater than the second received signal, and wherein the first pair of parallel coupled transistors are each of a first channel type; and
a second pair of parallel coupled transistors having commonly coupled control gates coupled to the second input, wherein the second pair of parallel coupled transistors is coupled to the first input and is configured to bias the first input to a reference potential when the received second signal is greater than the received first signal, and wherein the second pair of parallel coupled transistors are each of the first channel type;
a first transistor of a second channel type different than the first channel type and having a control gate coupled to the second input, wherein the first transistor of the second channel type is coupled to the first input and is configured to couple the first input to a voltage source when the second input is biased to the reference potential;
a second transistor of the second channel type and having a control gate coupled to the first input, wherein the second transistor of the second channel type is coupled to the second input and is configured to couple the second input to the voltage source when the first input is biased to the reference potential;
wherein the sense amplifier is configured to activate a first transistor of the first pair of parallel coupled transistors after activating the first transistor of the second channel type and while the second input is biased to the reference potential, and to activate a first transistor of the second pair of parallel coupled transistors after activating the second transistor of the second channel type and while the first input is biased to the reference potential; and
wherein the sense amplifier is further configured to deactivate a second transistor of the first pair of parallel coupled transistors after activating the first transistor of the first pair of parallel coupled transistors and while the second input is biased to the reference potential, and to deactivate a second transistor of the second pair of parallel coupled transistors after activating the first transistor of the second pair of parallel coupled transistors and while the first input is biased to the reference potential.

14. The memory device of claim 13, wherein the first transistor of the first pair of parallel coupled transistors and the first transistor of the second pair of parallel coupled transistors each has a higher activation voltage threshold than the second transistor of the respective first and second pair of parallel coupled transistors.

15. The memory device of claim 13, wherein the voltage source is configured to be deactivated after a particular time interval.

16. The memory device of claim 13, wherein the first and the second transistors of the second channel type comprise p-channel transistors and where the first pair and the second pair of parallel coupled transistors each comprise n-channel transistors.

17. The memory device of claim 13, wherein the memory device is selected from the group consisting of Dynamic Random Access Memory (DRAM), Synchronous DRAM (SDRAM), open-DRAM array memory, and a folded-DRAM array memory.

* * * * *

UNITED STATES PATENT AND TRADEMARK OFFICE
CERTIFICATE OF CORRECTION

| | |
|---|---|
| PATENT NO. | : 8,189,414 B2 |
| APPLICATION NO. | : 12/772681 |
| DATED | : May 29, 2012 |
| INVENTOR(S) | : Simon J. Lovett |

It is certified that error appears in the above-identified patent and that said Letters Patent is hereby corrected as shown below:

In column 6, line 5, in Claim 4, delete "ofparallel" and insert -- of parallel --, therefor.

In column 6, line 55, in Claim 9, before "another" delete "the".

Signed and Sealed this
Seventh Day of August, 2012

David J. Kappos
*Director of the United States Patent and Trademark Office*